Sept. 22, 1970 TOSHIO HAYAKAWA 3,529,478

TUNING DEVICE

Filed July 3, 1968

4 Sheets-Sheet 1

INVENTOR

TOSHIO HAYAKAWA

BY Stevens, Davis, Miller & Mosher

ATTORNEYS

Sept. 22, 1970 | TOSHIO HAYAKAWA | 3,529,478

TUNING DEVICE

Filed July 3, 1968 | 4 Sheets-Sheet 2

INVENTOR

TOSHIO HAYAKAWA

BY

ATTORNEYS

INVENTOR
TOSHIO HAYAKAWA

BY

ATTORNEYS

Sept. 22, 1970 TOSHIO HAYAKAWA 3,529,478

TUNING DEVICE

Filed July 3, 1968 4 Sheets-Sheet 4

INVENTOR

TOSHIO HAYAKAWA

BY

ATTORNEYS

United States Patent Office 3,529,478

Patented Sept. 22, 1970

3,529,478

TUNING DEVICE

Toshio Hayakawa, Kadoma-shi, Japan, assignor to Matsushita Electric Industrial Co., Ltd., Kadoma-shi, Osaka, Japan, a corporation of Japan Filed July 3, 1968, Ser. No. 742,399
Claims priority, application Japan, July 6, 1967, 42/58,965; Sept. 11, 1967, 42/78,488; Apr. 16, 1968, 43/31,970 (all utility models)
Int. Cl. F16h 35/18
U.S. Cl. 74—10.54 4 Claims

ABSTRACT OF THE DISCLOSURE

A tuning device, comprising a rotary shaft of adjusting means for performing the tuning operation, said rotary shaft being provided with a gear, a main adjusting shaft on which are mounted a pinion adapted for intermeshing with said gear and a cam member formed with a slot extending in "oblique direction," and a fine-tuning shaft provided integrally with a fine-tuning disk having a spiral guide slot formed therein, said fine-tuning disk being located in close relationship to said cam member, wherein the slot of said cam member and the spiral guide slot of said fine-tuning disk are coupled to each other through an operating pin. The pinion is rotated by the rotation of said main adjusting shaft so that the coarse-tuning operation is directly performed, and the operating pin is rotated by the rotation of the fine-tuning shaft along the guide slot of the fine-tuning disk while rotating the cam member having said operating pin inserted in the slot thereof so that the fine-tuning operation is performed.

This invention relates to a tuning device.

A variety of tuning devices have heretofore been developed. In the devices of this type, a mechanism capable of simultaneously achieving coarse tuning and fine tuning was required, and in practice such mechanism was adopted. Among the conventional tuning devices are the one designed to achieve coarse tuning and fine tuning by effecting speed reduction by the use of bearing and the one designed to achieve coarse tuning and fine tuning by effecting speed reduction by the use of a combination of gears.

Heretofore, such arrangements have most frequently been employed, but they are disadvantageous in that their construction is complicated, that difficulty is experienced in the assembling operation, and that the speed-reducing mechanism of the final product becomes large-sized. Thus, disadvantageously, the cost of manufacturing such conventional tuning devices becomes high, and the operation thereof is troublesome.

A primary object of the present invention is to provide a tuning device which is free from the foregoing drawbacks, of simplified construction and capable of positively performing the coarse tuning and fine tuning operations, and which can be manufactured at low cost.

Accordingly, the above object of the present invention may be accomplished in a tuning device including a tuning element to be adjusted, said tuning element having a rotary shaft, a main adjusting shaft, and a fine-tuning shaft, characterized in that a ger is provided on the rotary shaft of said tuning element to be adjusted, a pinion is mounted on said main shaft in such a manner that it is rotated in synchronism with said main adjusting shaft and in intermeshing relationship with said gear, a cam member is mounted on said main shaft, said cam member being formed with a slot extending in a direction which is non-radial with respect to said main shaft and non-perpendicular to the radial direction of said main shaft, a fine-tuning disk is mounted on said fine-tuning shaft in close relationship to said cam member, said fine-tuning disk being formed with a guide slot, said main shaft and said fine-tuning shaft being coaxially related to each other, one end of said operating pin is slidably inserted in the non-radial slot of said cam member and the guide slot of said fine-tuning disk, the other bent end of said operating pin is also slidably inserted in a damper member which is provided coaxially with respect to said main shaft, said operating pin is made to slide in the non-radial slot of said cam member in accordance with the guiding action of said guide slot which is produced through the rotation of said fine-tuning disk which is effected by rotating said fine tuning shaft, whereby the rotary shaft of said tuning element is slowly rotated through the pinion of said main shaft and said gear.

Other objects, features and advantages of the present invention will become apparent from the following description taken in conjunction with the accompanying drawings, in which.

Figure 1:
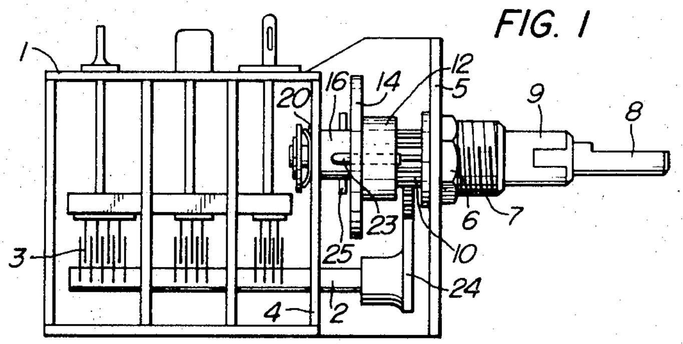
FIG. 1 is a side view showing the tuning device according to an embodiment of the present invention.
Figure 2:
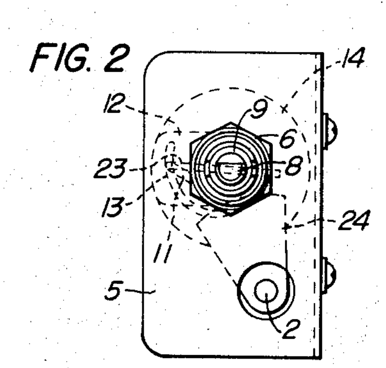
FIGS. 2, 3 and 4 are a front view of the FIG. 1 device, an exploded perspective view of the main portion thereof and a front view of said main portion, respectively.
Figure 4:
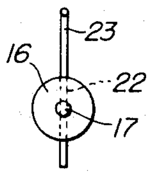
Figure 5A:
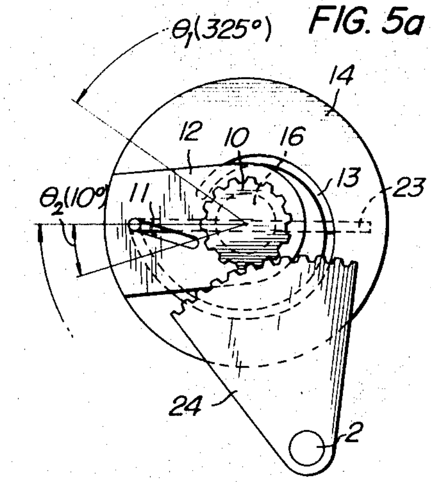
Figure 5B:
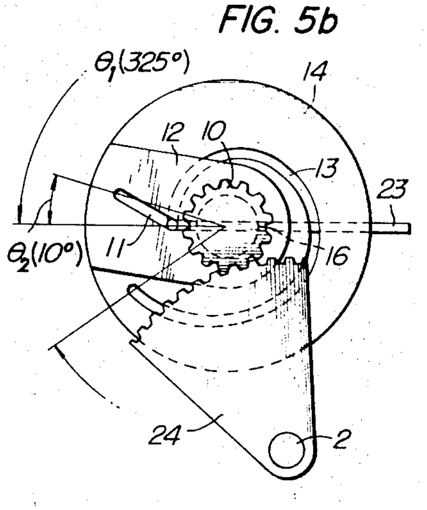
Figure 3:
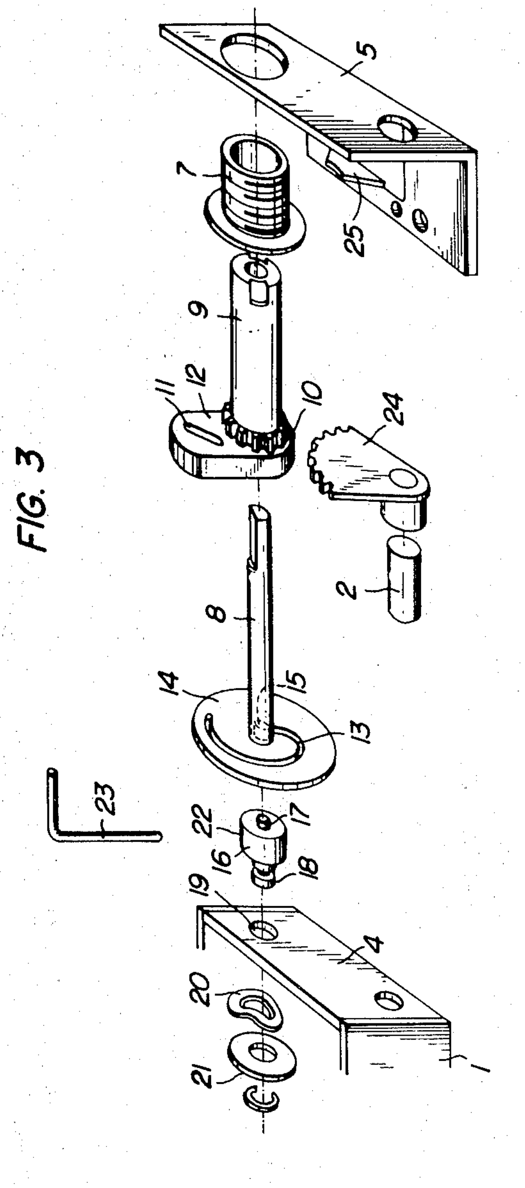
Figure 6:
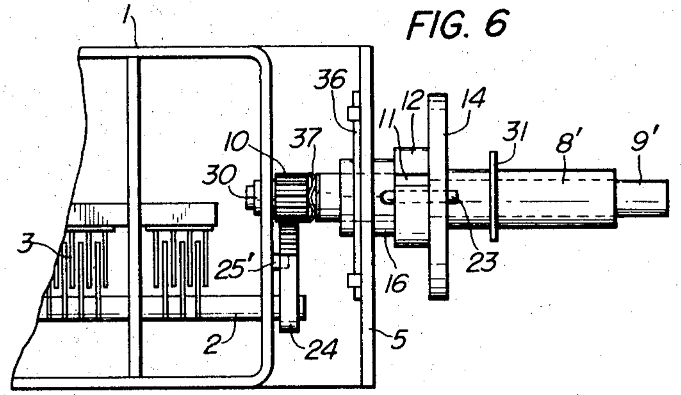
Figure 7:
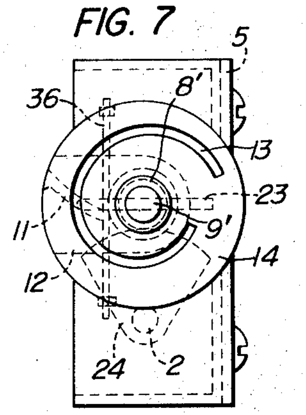
Figure 9:
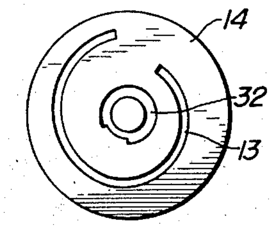
Figure 10:
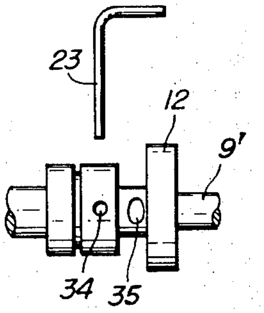
Figure 8:
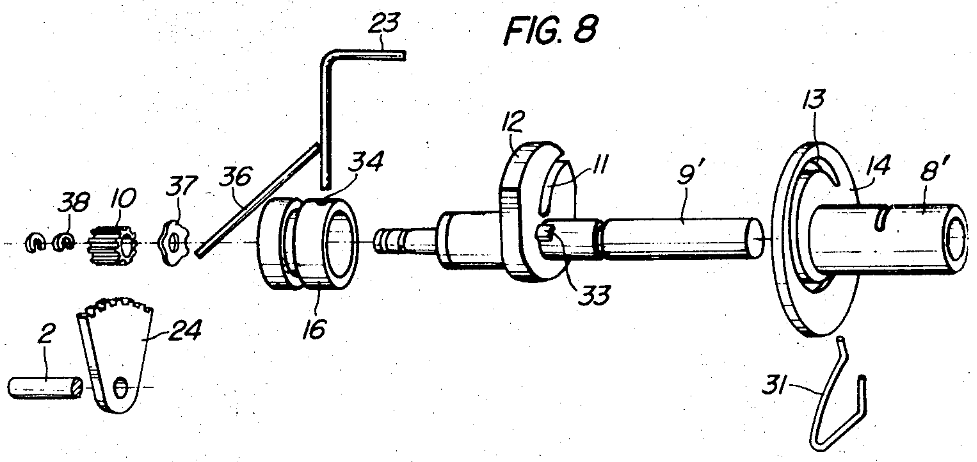
Figure 11:
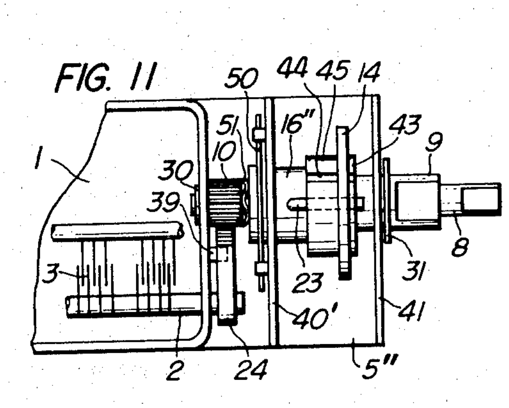
Figure 12:
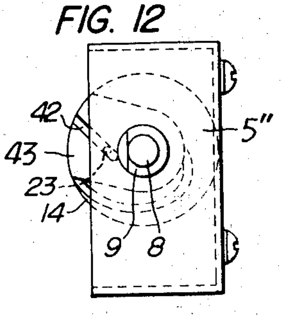
Figure 13:
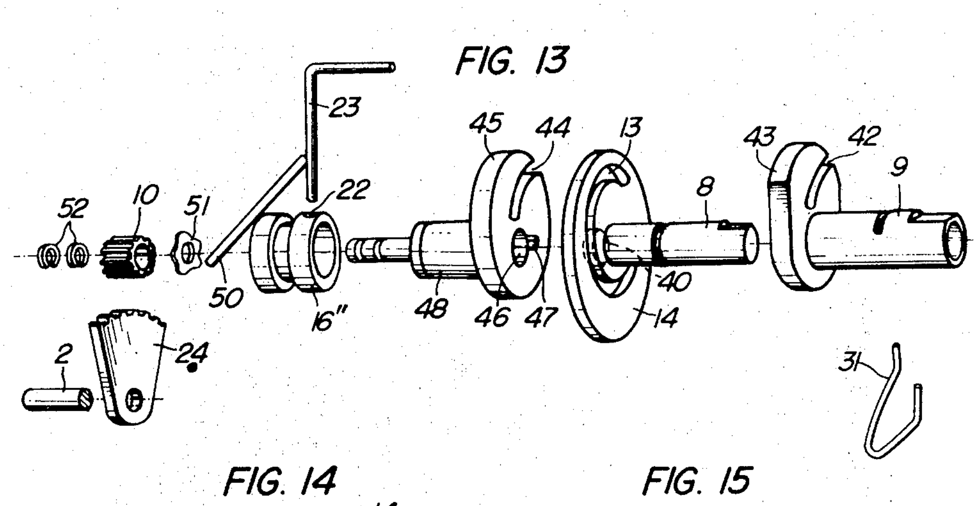
Figure 14:
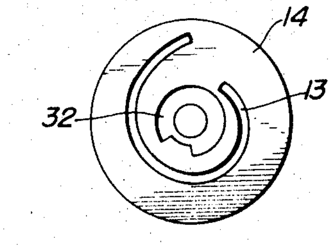
Figure 15:
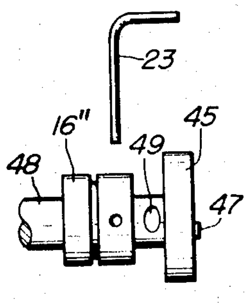

FIGS. *5a* and *5b* are views useful for explaining the fine-tuning operation of the device shown in FIG. 1;

FIG. 6 is a side view showing the tuning device according to a second embodiment of the present invention;

FIGS. 7, 8, 9 and 10 are a front view of the FIG. 6 device, an exploded perspective view of the main portion thereof, a rear view of the fine-tuning disk, and a side view of said main portion, respectively;

FIG. 11 is a side view showing the tuning device according to a third embodiment of the present invention; and FIGS. 12, 13, 14 and 15 are a front view of the FIG. 11 device, an exploded perspective view of the main portion thereof, a rear view of the fine-tuning disk and a side view of said main portion, respectively.

In the drawings, corresponding elements are indicated by like reference numerals.

Description will first be made of the embodiment shown in FIGS. 1 to 6, wherein the reference numeral 1 represents a tuning device body accommodating therein a variable capacitor 3 comprising a combination of stator plates and rotor plates mounted on a rotor shaft 2 for rotation. Attached to the front portion of the body 1 is an L-shaped mounted plate 5 in parallel spaced relationship to a front plate 4 of said body. A main adjusting shaft 9 extends through the mount plate 5, said main adjusting shaft 9 having a fine-tuning shaft 8 fitted thereinto and being rotatably supported on a bearing 7 which s fixed to the mount plate 5 by means of a nut 6. On one end of the main adjusting shaft 9 are integrally provided a pinion 10 and a cam member 12 formed with a slot 11 extending in an oblique direction. The "oblique direction" referred to here may be a direction that is non-radial with respect to the main adjusting shaft 9 and yet non-perpendicular to the radial direction of said main shaft. Attached to one end of the fine-tuning shaft 8 is also integrally a fine-tuning disk 14 formed with a spiral guide slot 13. A hole 15 is formed in the center portion of the outer surface of the fine-tuning disk 14, and a projection 17 of a damper member 16 is fitted in the hole 15.

A support shaft 18 is provided on that surface of the damper member 16 which is opposite to the surface where the projection 17 is provided, and it extends through a hole 19 formed in the front plate 4 of the main body 1. The fore end portion of the support shaft 18 is frictionally retarded to the main body 1 by means of a damper spring ring 20 and fittings 21. Thus the main adjusting shaft 9 and fine-tuning shaft 8 are rotatably mounted on the main body 1. The damper member 16 is formed with a through-aperture 22 in the side surface thereof and one end of an operating pin 23 of a metal material which is bent in L-shape is inserted in the through-aperture 22. The other end of the operating pin 23 is inserted in the cam groove 13 of the fine-tuning disk 14 and the slot 11 formed in the cam member 12.

The pinion 10 of the cam member 12 adapted for rotation with the main adjusting shaft 9 is disposed in intermeshing relationship with a fan-like gear 24 mounted on the rotor shaft 2 of the aforementioned variable capacitor 3. Further, provided on the mount plate 5 is a stopper projection 25 which is adapted for engagement with the above-described operating pin 23 to thereby restrain the rotation of said main adjusting shaft 9.

Description will now be made of the operation of the foregoing arrangement. Coarse tuning can be effected merely by roating the main adjusting shaft 9 either to the left or the right. That is, the rotation of the main adjusting shaft 9 results in the pinion 10 integral with the cam member 12 being rotated so that the variable capacitor 3 is driven through the fan-like gear 24, thus making it possible to achieve coarse tuning. In this case, the main adjusting shaft 9 is rotated until the operating pin 23 is placed into engagement with the stopper projection 25 as a result of the rotation of the pin 23 which is caused by the rotation of the cam member 12. The extent of rotation of the main adjusting shaft 9 is so selected as to correspond to the necessary extent of rotation of the variable capacitor 3.

In an attempt to achieve fine-tuning, the fine-tuning shaft 8 is roated either to the left or to the right. The rotation of the fine-tuning shaft 8 results in the fine-tuning disk 14 being rotated so that the operating pin 23 inserted in the through-aperture 22 formed in the damper member 16 is upwardly or downwardly moved along the cam groove 13 of the fine-tuning disk 14 while being guided by the through aperture 22. At this point, the cam member 12 is rotated in the same direction as the rotating direction of the fine-tuning shaft 8 by the operating pin 23 since the operating pin 23 is also inserted in the "oblique" slot 11 of the cam member 12, so that the pinion 10 integral with the cam member 12 is also rotated to rotate the fan-like gear 24. Thus, the fine-tuning operation is performed. The extent of rotation of the fine-tuning shaft 8 is determined by the guide slot 13 of the fine-tuning disk 14, and the angle of rotation $\theta_1$ is set to about 325 degrees (325°) for example.

Although the angle of rotation of the fine-tuning shaft 8 is set to about 325° as described above, the angular range $\theta_2$ over which the pinion 10 is actually rotated is as small as 10°, for example, which corresponds to the lateral width or range of the upward or downward movement of the operating pin 23 along the "oblique" slot 11 of the cam member 12. Thus, the capacitance of the variable capacitor 3 can be varied very minutely as compared with the case where such capacitance is changed by means of the main adjusting shaft. In this way, fine tuning can be achieved, in addition to coarse tuning by the main adjusting shaft 9.

The fine-tuning achieved by means of said fine-tuning shaft 8 is controlled in accordance with the lateral width of the oblique slot 11 of the cam member 12, and if the fine-tuning shaft 8 is further rotated after the operating pin 23 has been brought into engagement with the end of the slot 11, the cam member 12 is rotated by the operating pin 23 so that the pinion 10 is rotated, thus achieving coarse tuning in the same manner as in the case where the main adjusting shaft 9 is rotated.

A second embodiment of the present invention will now be described with reference to FIGS. 6 to 10. The reference numeral 1 represents a tuning device body in which a variable capacitor 3 is incorporated. An L-shaped mount plate 5 is attached to the front portion of the device body 1 with a predetermined spacing maintained therebetween.

A main adjusting shaft 9′ extends through the mount plate 5, one end of the shaft being supported by a bearing means 30 provided on the device body 1. Inserted on that portion of the other end of the main adjusting shaft 9′ which projects out of the mount plate 5 is a fine-tuning shaft 8′ which extends axially of the main adjusting shaft 9′ and is related to the latter by means of a snap spring 31. The fine-tuning shaft 8′ is provided with an integral fine-tuning disk 14 formed with a spiral guide slot 13. In the center portion of the fine-tuning disk 14, there is provided a notched portion 32 which extends over a range of 340 degrees. Further, the main adjusting shaft 9′ is provided with an integral cam plate 12 formed with an "oblique" slot 11 adapted for producing a camming function. A stopper 33 is provided on the main adjusting shaft 9′ in front of the cam plate 12, and it is disposed in engagement with the notched portion 32 of the said fine-tuning disk 14.

A damper 16 is fitted on the main adjusting shaft 9′ at the back of the cam plate 12, and it is attached to the mount plate 5 so as to serve as an intermediate bearing for the main adjusting shaft 9′. The damper 16 is formed with a through-aperture 34. An elongated hole 35 is formed in the main adjusting shaft 9′ at that position which corresponds to the through-aperture 34 of the damper 16. An operating pin 23 of a metal material bent in L-shape is inserted in the through-aperture 34 and elongated hole 35. One end of the operating pin 23 is inserted in the slot 11 of the cam plate 12 and the guide slot 13 of the fine-tuning disk 14.

A damper spring 36 is pressed against that portion of the damper 16 which is positioned internally of the mount plate 5 so as to prevent the damper 16 from rotating in the case of the fine tuning operation. Further, a pinion 10 is fixed in place by means of a snap ring 38, and it is disposed in contact with the one end of the main adjusting shaft 9′ through a corrugated spring washer 37. The pinion 10 intermeshes with the fan-like gear 24 mounted on the rotor shaft 2 of the variable capacitor 3. A stopper projection 25′ is provided in the neighborhood of the fan-like gear 24.

The operation of the foregoing arrangement will be described below.

First of all, in an attempt to achieve coarse tuning, the main adjusting shaft 9′ is rotated either to the left or to the right so that the fan-like gear 24 is greatly rotated by the rotation of the main adjusting shaft 9′ transmitted thereto through the pinion 10. Thus, coarse tuning can be achieved. In this case, the extent of rotation of the fan-like gear 24 is determined by the stopper projection 25′ so as to be sufficient for the required extent of rotation of the variable capacitor 3.

In order to achieve fine tuning, the fine-tuning shaft 8′ is rotated. The direction of rotation of the fine-tuning shaft 8′ is opposite to that for the case where coarse tuning is effected by the use of the coarse-tuning shaft 9′. Assume that the fine-tuning shaft 8′ is rotated clockwise. Then, the operating pin 23 inserted in the damper 16 is downwardly moved along the slot 11 of the fine-tuning disk 14. At this point, the operating pin 23 causes the cam plate 12 to be gradually rotated clockwise since it is also inserted in the guide slot 11 of the cam plate 12. Consequently, the main adjusting shaft 9′ on which the cam plate 12 is integrally provided is gradually rotated clockwise. The extent of rotation of the fine-tuning shaft 8′ is determined by the relationship between the notched portion 32 and the stopper 33. In the illustrated example, the angle of rotation of the fine-tuning shaft 8′ is about 340 degrees. Thus, within this angular range, the main adjusting shaft 9′ is rotated only slightly as compared with the case of coarse tuning, so that fine-tuning can be achieved.

If the rotation is effected through an angle of 340°, then the stopper 33 is brought into engagement with the end of the notched portion 32, so that the fine-tuning shaft 8' and the main adjusting shaft 9' become integral with each other. Thus, by further rotation, the fine-tuning operation is switched to the coarse-tuning operation.

A third embodiment of the present invention will be described with reference to FIGS. 11 to 15. The reference numeral 1 represents the tuning device body in which a variable capacitor 3 is incorporated. An L-shaped mount plate 5'' is attached to the front portion of the device body 1 with a predetermined spacing maintained therebetween. The mount plate 5'' comprises two projecting plates 40' and 41, and spaces are defined between the tuning device body 1 and one of the plate 40' and between the plates 40' and 41 respectively. A main adjusting shaft 9 having a fine-tuning shaft 8 fitted therein extends through the front plate 41. On the fore end of the fine-tuning shaft 8, there is integrally provided a fine-tuning disk 14 formed with a spiral guide slot 13. Further, a projection 40 is provided in the center portion of the fine-tuning disk 14, and a notched portion 32 is formed around the projection 40 in such a manner as to extend over an angular range of 340 degrees, for example. On the fore end of the main adjusting shaft 9, there is integrally provided a cam plate 43 formed with a slot 42 which extends in "oblique direction," and a snap spring 31 is fitted in the main adjusting shaft 9, whereby the main adjusting shaft 9 is supported axially with respect to the fine-tuning shaft 8.

A cam member 45 formed with an "oblique" slot 44 adapted for producing a camming function is provided at the position corresponding to the aforementioned fine-tuning disk 14. The cam member 45 is further formed with a through-aperture 46 adapted for engagement with the projection 40 described above, and it is provided with a stopper 47 in the neighborhood of the through-aperture 46. The stopper 47 is adapted to be disposed in engagement with the notched portion 32 of the fine-tuning disk 14. Further, the cam member 45 is provided with an integral drive shaft 48 to which is imparted a driving force from the main adjusting shaft 9 and the fine-tuning shaft 8. The free end of the drive shaft 48 is supported by a bearing means 30 of the tuning device body 1. A damper member 16'' is fitted on the drive shaft 48, and it is supported by the projecting piece 40' of the mount plate 5 so as to serve as an intermediate bearing for the drive shaft 48. The damper member 16'' is formed with a through-aperture 22. Further, the drive shaft 48 is formed with an elongated hole 49 at that position which corresponds to the through-aperture 22 of the damper member 16'', and an operating pin 23 of a metal material bent in L-shape is inserted in the through-aperture 22 and the elongated hole 49. One end of the operating pin 23 is inserted in the slot 44 of the cam plate 45, the guide slot 13 of the fine-tuning disk 14 and the slot 42 of the cam member 43.

A damper spring 50 for damping the damper member 16'' is pressed against that portion of said damper member 16'' which is located internally of the plate 40' of the mount plate 5'', so that the damper is free from rotation with that of the drive shaft when the fine tuning is performed. A pinion 10 is fixed by means of a snap ring 52 in closest relationship to the free end of the drive shaft 48 with a corrugated spring washer 51 interposed therebetween. The pinion 10 intermeshes with the fan-like gear 24 mounted on the rotor shaft 2 of the variable capacitor 3. A stopper projection 39 is provided in the neighborhood of the fan-like gear 24.

Description will now be made of the operation of the tuning device having the arrangement just described above.

First, in order to achieve coarse tuning, the main adjusting shaft is rotated either to the left or to the right, so that the rotating force of the cam member 43 is imparted directly to the cam plate 45 since the spiral guide slot of the cam member 43 of the main adjusting shaft 9 and the cam plate 45 are of the same configuration, and guide slot 13 of fine-tuning disk 14 is not of like configuration, whereby the pinion 10 is rotated to drive the variable capacitor 3 through the fan-like gear 24. Thus, a coarse tuning operation can be performed.

In this case, the extent of rotation of the fan-like gear 24 is determined by the stopper projection 39 so as to be sufficient for the required extent of rotation of the variable capacitor 3.

In order to achieve fine-tuning, the fine-tuning shaft 8 is rotated. The direction of rotation of the shaft 8 may be either to the left or to the right. Upon initiation of the rotation of the shaft 8, the fine-tuning disk 14 is similarly rotated. The rotation of the fine-tuning disk 14 results in the operating pin 23 inserted in the damper member 16'' being downwardly moved along the guide slot 13 of the fine-tuning disk 14. At this point, the cam member 45 is rotated in the same direction as the fine-tuning shaft 8, since the operating pin has been inserted also in the slot 44 of the cam plate 45. Consequently, the pinion 10 integral with the cam plate 45 is gradually rotated. The extent of rotation of the fine-tuning shaft 8 is determined by the relationship between the notched portion 32 and the stopper 47. In the illustrated example, the angular range is about 340 degrees. Thus, within this angular range, the main tuning shaft 9 is rotated only slightly as compared with the case of coarse tuning, so that fine tuning can be achieved.

If the rotation is effected through an angle of 340°, then the stopper 47 is brought into engagement with the end portion 32 of the cam plate 45 so that the fine-tuning shaft 8 and the cam plate 45 become integral with each other. Thus, by further rotation, the fine-tuning operation is switched to the coarse-tuning operation.

As described above, in accordance with the present invention, the pinion is integrally rotated by the rotation of the main tuning shaft so that the adjusting members are driven through the gear, thus resulting in coarse tuning. Furthermore, the operating pin is moved along the spiral guide slot of the fine-tuning disk by the rotation of the fine-tuning shaft. At this point, since the slot formed in the cam member extends in "oblique direction," the cam member is rotated through an angle corresponding to the lateral width of the slot formed therein, so that fine tuning can be achieved. The extent of fine tuning depends upon the range of displacement of the operating pin in said oblique slot, and further rotation of the fine-tuning shaft causes the fine-tuning operation to be switched to the coarse-tuning operation. The foregoing operational effects can be obtained by a simplified arrangement wherein the cam member of the main tuning shaft and the fine-tuning disk of the fine-tuning shaft are related to each other through the operating pin. Furthermore, the operation can be performed very easily and smoothly, and therefore the possibility of trouble can be minimized so that the coarse and fine-tuning operations can be performed always accurately. Still furthermore, an indicator can be conveniently provided by locating the main tuning shaft at the outermost position. From the foregoing, it will be appreciated that the present invention has great utility.

What is claimed is:

1. A tuning device comprising a tuning element to be adjusted, said tuning element having a rotary shaft, a main adjusting shaft, and a fine-tuning shaft; a gear provided on the rotary shaft of said tuning element to be adjusted; supporting plate means for said shafts; a pinion mounted on said main shaft in such a manner that it is rotated in synchronism with said main adjusting shaft and in intermeshing relationship with said gear; at least one cam member mounted on said main shaft, said cam member being formed with a slot extending in a direction which is non-radial with respect to said main shaft and non-perpendicular to the radial direction of said main shaft; a fine-tuning disk mounted on said fine-tuning shaft in close relationship to said cam member, said fine-tuning disk being formed with a guide slot, said main shaft and said fine-tuning shaft being coaxially related to each other; an operating pin, said pin having its one end slidably inserted in the non-radial slot of said cam member and the guide slot of said fine-tuning disk, and its other bent end slidably inserted in a damper member which is provided coaxially with respect to said main shaft and is frictionally retarded to said supporting plate means by damper spring means, so that when said fine-tuning shaft, and, consequently, said fine-tuning disk, are rotated, said operating pin slides in the non-radial slot of said cam member in accordance with the guiding action of said guide slot, whereby said cam member and, consequently, the rotary shaft of said tuning element are slowly rotated through the pinion of said main shaft and said gear.

2. A tuning device as set forth in claim 1, wherein said fine-tuning shaft is fitted into said main adjusting shaft, thereby facilitating the indication of the amount of the main adjustment.

3. A tuning device as set forth in claim 1, wherein the guide slot formed in said fine-tuning disk is configured in spiral shape, said cam member is rotated integrally with said fine-tuning disk through said operating pin by further rotating said fine-tuning shaft after said operating pin has been brought into contact with either end portion of said non-radial slot of the cam member by the rotation of said fine-tuning shaft, so that coarse tuning is achieved subsequent to fine tuning.

4. A tuning device as set forth in claim 1, wherein a pair of cam members is mounted on said main shaft, one of which is fixedly mounted on said main shaft, and the other of which is fixedly mounted on a drive shaft interposed between said pinion and said fine-tuning shaft, each of said cam members being formed with an identical non-radial slot with said fine-tuning disk being interposed between said pair of cam members, whereby the fine-tuning operation can be performed positively.

References Cited

UNITED STATES PATENTS 1,563,758 12/1925 Lindberg -------- 74—10.54 X
2,716,897 9/1955 Wulfsberg --------- 74—10.54

FOREIGN PATENTS 340,537 1/1931 Great Britain.

MILTON KAUFMAN, Primary Examiner

U.S. Cl. X.R.

74—10.6, 10.8